United States Patent [19]
Krüger

[11] Patent Number: 4,707,655
[45] Date of Patent: Nov. 17, 1987

[54] CONTACT FOR MULTICONTACT PROBE ASSEMBLY

[75] Inventor: Gustave Krüger, Herrenberg, Fed. Rep. of Germany

[73] Assignee: Feinmetall GmbH, Herrenberg, Fed. Rep. of Germany

[21] Appl. No.: 743,589

[22] Filed: Jun. 11, 1985

[30] Foreign Application Priority Data

Jun. 12, 1984 [DE] Fed. Rep. of Germany ....... 3421720

[51] Int. Cl.$^4$ ............................................. G01R 1/06
[52] U.S. Cl. .................................. 324/158 P; 439/482
[58] Field of Search ............ 324/158 P, 158 F, 73 PC, 324/72.5, 149; 339/95 R, 96, 97 T, 150 B, 108 TP, 255 R, 252 R, 17 M, 17 LM

[56] References Cited

U.S. PATENT DOCUMENTS

| | | | |
|---|---|---|---|
| 1,329,448 | 2/1920 | Von Post | 339/95 R |
| 3,676,776 | 7/1972 | Bauer et al. | 339/108 TP X |
| 4,321,532 | 3/1982 | Luna | 324/73 PC X |
| 4,535,536 | 8/1985 | Wyss | 324/158 F X |
| 4,560,223 | 12/1985 | Cooney et al. | 324/158 P X |

FOREIGN PATENT DOCUMENTS

| | | | |
|---|---|---|---|
| 3340184 | 5/1985 | Fed. Rep. of Germany | 324/158 F |
| 60-49270 | 3/1985 | Japan | 324/158 F |
| 723703 | 4/1980 | U.S.S.R. | 339/255 R |

*Primary Examiner*—Reinhard J. Eisenzopf
*Assistant Examiner*—Stephen M. Baker
*Attorney, Agent, or Firm*—Erwin S. Teltscher

[57] ABSTRACT

A contact for a multicontact probe assembly for testing at least partially conductive elements has a conductive contact rod extending along a axis and having a rear end and a forwardly directed and pointed front test end of construction suitable for using alone as a test point. A respective conductive cap engageable axially snugly over the pointed front end of the rod can be releasably secured on the pointed front end for use of the same rod to test, for example, a bushing or a bore connection. Thus a single contact can serve several functions, making the probe assembly having it much more versatile than prior-art systems. Only some of the contact rods of a probe assembly, those destined to engage large-diameter bores or bushings, need be equipped with the heads, and the small pointed tips of the remaining rods of the assembly can engage and contact the strips or smaller holes or bushings directly.

16 Claims, 5 Drawing Figures

U.S. Patent  Nov. 17, 1987  Sheet 1 of 2  4,707,655
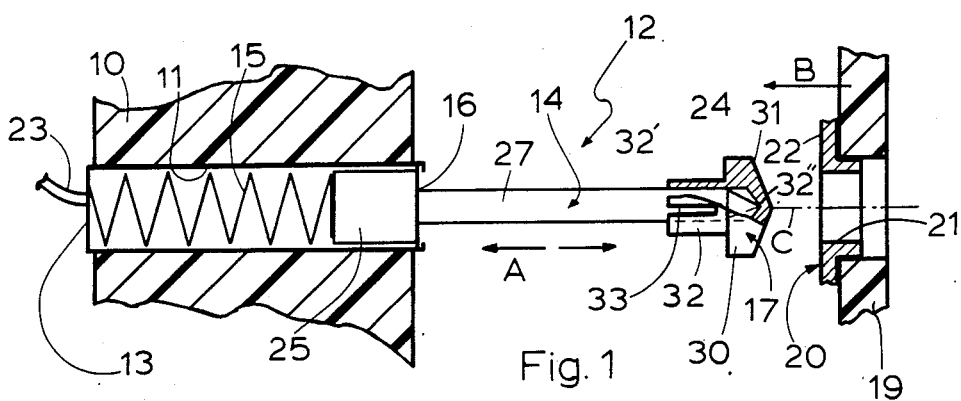
Fig. 1
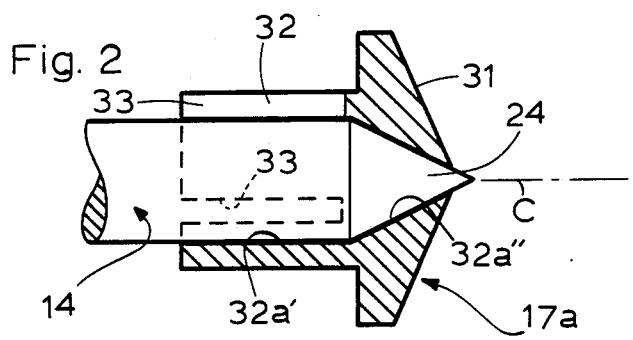
Fig. 2
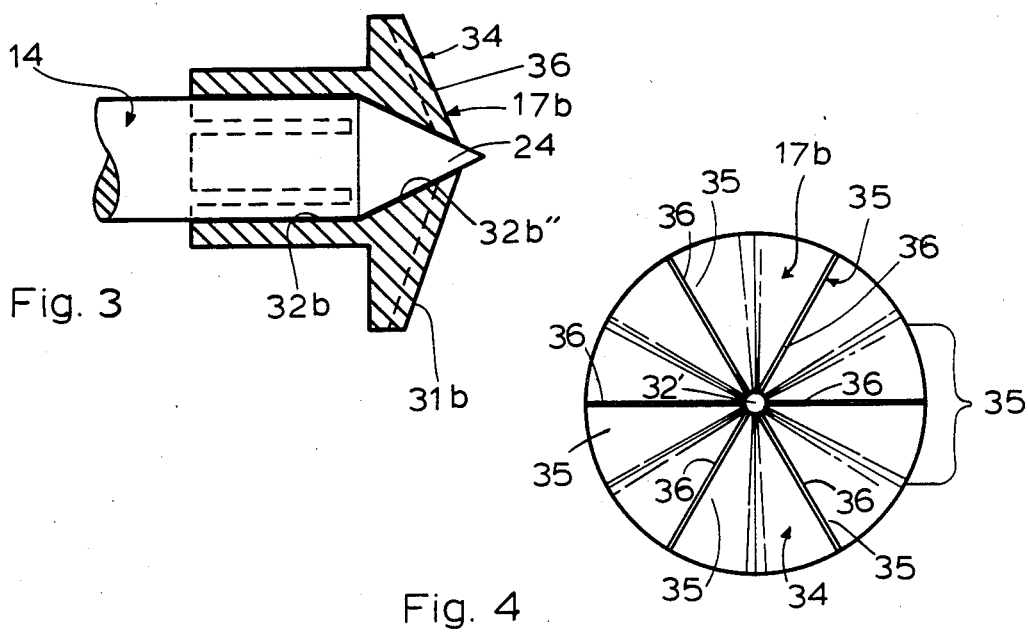
Fig. 3
Fig. 4

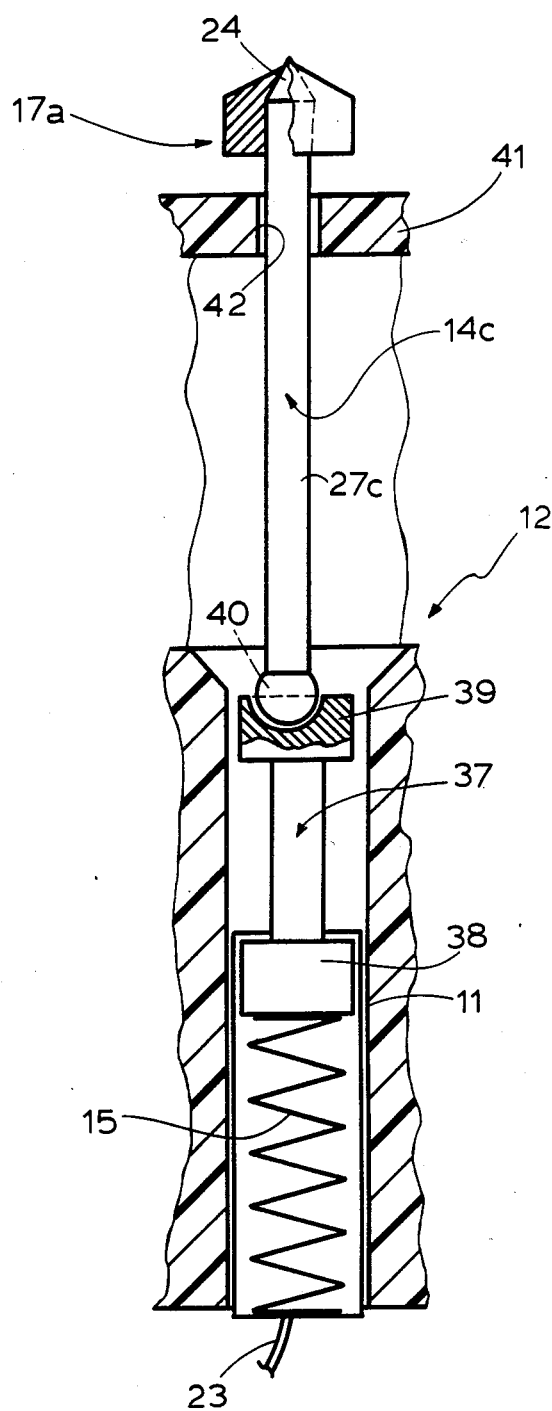

CONTACT FOR MULTICONTACT PROBE ASSEMBLY

FIELD OF THE INVENTION

The present invention relates to a device used typically to test printed-circuit boards and the like and having a multicontact probe assembly. More particularly this invention concerns the contact that is used in such a probe assembly.

BACKGROUND OF THE INVENTION

A printed-circuit board is a dielectric plate carrying on one or both faces a network of lines of a conductive material such as copper that are either printed on the plate or created by etching out the copper between the lines on a completely copper-plated plate. The board is drilled at the conductive lines to create holes that allow the leads of circuit elements to be soldered in place and that allow if necessary connection to be made from a line on one face of the board to a line on the opposite face. Before circuit elements are soldered to the board it is necessary to test it, both to ascertain that each of the lines is electrically continuous, and to verify that there are no unwanted connections between lines that are supposed to be electrically independent. Any error whatsoever of continuity or discontinuity makes the board usable, a reject.

The testing apparatus has a probe assembly with a multiplicity of finger-like contacts whose tips are simultaeously brought into contact with the various lines. The contacts are arrayed such that one contact engages each end of each conductive line or the end of any extension thereof. Such an arrangement is described in jointly filed and copending patent application Ser. No. 743,671 now U.S. Pat. No. 4,686,465.

To accommodate different sizes of boards the support board of the probe assembly is provided with a multiplicity of densely spaced depressible supports. A tight grid of such supports is provided, with the supports independently connected to an electronic test and analyzing device, and the grid is at least as large as the largest board to be tested. Thus when the board to be tested and the array of supports are juxtaposed, there will be at least one support generally aligned with the end of every line or segment thereof as well as with any bores in the board. The contacts are rods supported on those supports which lie generally in the right position relative to the locations to be contacted. Only those contacts needed for a specific test are mounted on supports, and a mask is provided to orient the forward ends of the contact rods appropriately for the specific board being tested. The supports allow the contact rods to be depressed back into the probe assembly so that when the board is pressed back or the assembly is pressed up against the board the contacts will all bear with a certain standard pressure against the points being tested, thereby making the resistance at the interface between the front end of the contact and the line being tested uniform for all the contacts.

For best contact with a standard printed-circuit conductor line it is standard to use contact rods whose forward contact ends are somewhat pointed. When they are to be used to test a grommet, socket, or similar bushing fitted in the board it is standard as described in U.S. Pat. No. 3,676,776 to form the contact ends of the rods as balls so that they will naturally fit and center themselves within the invariably circular holes and collars on the boards. This patent also describes an arrangement wherein the contact rod is cylindrical with a squared-off front end which carries a part-spherical removable tip. It is further possible to form the tip with a rearwardly projecting end pin that can fit in the front end of the rod. Such an arrangement allows the tips to be changed for different applications, nonetheless it requires that a complete set of tips be maintained on the contacts at all times, and the necessary construction is often expensive or requires relatively thick contact rods to be used.

OBJECTS OF THE INVENTION

It is therefore an object of the present invention to provide an improved contact for a multicontact probe assembly.

Another object of the invention is to provide a conductive cap engageable with a front end of a contact rod and adapted to contact differently formed test points of a circuit board, without the contact rods themselves having to be changed or replaced.

SUMMARY OF THE INVENTION

This object is attained in a contact for a multicontact probe assembly for testing at least partially conductive elements, and wherein the contact includes a conductive contact rod extending along an axis and has a rear end and a front end, by providing a conductive cap axially engageable over the front end of the rod, and securing means for releasably securing the cap on the front end.

As a result of the replaceable cap the contact rods of the contact or contact element may be matched to differently formed test points on the conductive elements, simply by fitting over the contact rods of the contact or contact element caps matched to the respective test points. It will of course be understood that where it is not necessary to fit a contact rod with a cap, as the assembly of contact rods is already matched to the test points of the circuit board, it is preferable not to use the cap. The cap will only be used when its use is necessary in relation to the test points to be tested.

As a result of the present invention it is therefore no longer necessary to replace the contact rods, or the entire contacts, if the geometry of the tip of the contact rods must be changed in order to match it to the test points of the circuit board.

The invention also covers a contact head itself, wherein the contact head includes the cap employed in the inventive contact for a multicontact probe assembly, as the contact head may be manufactured and sold separately, independently of the inventive contact.

The securing means releasably securing the cap to the front end of the contact rod may be implemented in various ways. It is particularly simple and advantageous if the cap is firmly seated on the contact rod, being held thereto, for example, by friction, but wherein it can nevertheless be easily removed from the seat, and again fitted thereonto easily, such as providing a snap fit over a bump, a sliding fit or the like.

The cap is secured to the contact rod in a particularly simple and reliable manner, which also permits a high degree of tolerance, if the securing means is a collar formed on the cap and provided with a plurality of rearwardly open slots so as to elastically grip the rod in back of its front end.

Other securing means are also conceivable. Thus in many cases it may be advangtageous to provide the cap with an inner thread, which in turn may be threaded onto an outer thread on the contact rod. It is also possible to employ a bayonet coupling to secure the cap to the contact rod. But other possibilities exist also. Thus in many cases it may be advantageous to provide the aforedescribed snap fit over a bump. In a variant of this inventive thought, the aforedescribed collar formed with the aforedescribed rearwardly open slots is made so that the resultant fingers are bent somewhat inwardly and engage an annular groove formed in the contact rod when the cap is fitted theronto.

According to another feature of this invention the cap has a front surface lying on a frustocone, that is the outer surface of a truncated cone, centered on the axis. The front face can be smoothly conical or frustoconical, or the front face of the cap can be formed with axially forwardly projecting and radially extending edges lying on the frustocone. This provides good scraping action, which is particularly useful when engaging a bushing or the like which might have oxidized.

DESCRIPTION OF THE DRAWING

FIG. 1 is an axial section through a contact assembly of a multicontact probe according to the invention;

FIG. 2 is a large-scale sectional view corresponding to a detail of FIG. 1 illustrating another contact cap according to the invention;

FIG. 3 is a view like FIG. 2 through yet another cap in accordance with this invention;

FIG. 4 is a right-hand end view of the cap of FIG. 3; and

FIG. 5 is another section like FIG. 1 illustrating another contact assembly according to the invention.

SPECIFIC DESCRIPTION

FIG. 1 shows a contact assembly 12 for a printed-circuit board 19 formed with a hole lined with a bushing 20 having a cylindrical internal collar or leg 21 snugly fitted in the hole and a planar outer flange 22 lying on the face of the board 19 around the hole. The probe assembly has a dielectric base plate 10 provided with an array of supports for respective contacts 14, which are in a dense grid array and may number in the thousands. A test device can be connected as described in the above-cited copending application to the contacts 14 for measuring current flow between them, as they are maintained electrically independent by the insulating plate 10.

Each contact 14 is a solid rod 27 made of a rigid and conductive metal such as steel, brass, or bronze and has a front end formed with a conically forwardly pointed tip 24 centered on the axis C. Thus the widest part of the rod 27 is the rear end 25, the front end either being cylindrical or conical.

Each of the supports is received in a respective bore formed in the plate 10 and is basically formed of a cylindrical and conductive guide sleeve 11 having a closed rear end 113 to which a respective wire 23 is soldered and a spring 15 braced between the closed floor 13 of the sleeve 11 and the plunger-like rear end 25 of the solid rod 27 forming the rest of the contact 14. The front end of the sleeve 11 is bent in around the front edge 16 of the enlarged rear end 25 of the contact 14, to confine same so that it cannot be pushed forwardly therefrom along the axis C of the sleeve 11 but can be depressed axially back in the direction A in the sleeve 11 while compressing the spring 15. The rear end 25 of the contact 14 is in excellent electrical contact with the sleeve 11, both by engagement with the inner faces of the sides thereof and via the spring 15.

According to this invention the front end 24 of the contact 14 carries a conductive contact cap 17 that has, relative to the axis C, a massive front head 30 forming a forwardly directed, centered, and backwardly flaring frustoconical surface 31, and a rearwardly directed mounting collar 32 formed with a rearwardly open cylindrical bore 32' having a forwardly tapering and conical front end 32" and fittin snugly around the rod 27 behind its tip 24. The metal of the cap 17 is slightly elastic and the collar 32 is formed with three angularly equispaced, axially rearwardly open and radially throughgoing slots 33 that allow the collar 32 to engage elastically and snugly on the front end of the rod 27.

In use the board 19 to be tested is pressed back in direction B against the probe assembly having a multiplicity of appropriately arrayed contact assemblies 12. As the bushing 20 engages the cap 17 the contact 14 will be pushed back. Thus the contact 14 will bear forward on the bushing 20 and backward on the respective sleeve 11 with substantially the same force. The surface 31 is sufficiently pointed that it will naturally center in the bushing 20 and is of sufficiently great outer diameter that it cannot, like the rod part 27, engage through and past the bushing 20 without touching it.

In addition according to this invention it would be possible to eliminate the cap 17 to allow the respective tip 24 to be used directly to engage, for instance, a portion of a conductive copper strip on a printed-circuit board, in the manner described in my above-cited copending patent application.

In the arrangement of FIG. 2 the cap 17a is formed with a bore 32a', 32a" whose rear portion 32a', just like in FIG. 1, is cylindrical, slotted, and snugly engages the cylindrical body of the rod 27, but whose front bore portion 32a" is frustoconically complementary to the tip 24 and axially throughgoing so that this tip 24 projects axially less than 1mm forward through the cap 17a. Such an arrangement can serve double duty both as a bushing tester and a conductor-strip tester.

In the arrangement of FIGS. 3 and 4 the cap 17b is internally formed with a bore 32b', 32b" identical to that of FIG. 2. The front face of the cap 17b, however, is formed with six radially extending, axially centered, and identical teeth 35 having flanks 34 and defining angled straight edges 36 lying on a frustoconical surface 31b identical to the surface 31 of FIGS. 1 and 2. This cap 17b is self-centering like the caps 17a and 17, and will bear in line contact via all the individual edges 36 on the bushing 20 for excellent self-cleaning action as described in the above-cited copending application. Thus any oxide coat on the bushing 20 being tested will be scraped off at the contact zones.

FIG. 5 shows how a contact 14c is formed of a rod 27c having a rear ball end 40 and of a plunger 37 having a front socket end 39 and a rear end 38 functionally identical to the part 25 of FIG. 1. The fit of the ball end 40 in the complementarily shaped socket end 39 allows the axis of the rod part 27c to be out of line with the center axis of the spool plunger 37, as also described in detail in the copending application. Thus the rod part 27c can fit through a hole 42 in a mask 41 for engagement with a bushing or conductive strip not in perfect axial line with the support sleeve 11.

APPLICATIONS OF THE DIFFERENT EMBODIMENTS

With the system of this invention, therefore, the contact rod can work with or without a cap. When used without a cap, it is perfectly suited for testing unbored portions of printedcircuit boards.

However, when a region on a circuit board without a cap 17 secured to the contact 14 cannot make good or adequate electrical contact with a test point on the circuit board the cap 17 is then fitted onto the contact 14. This applies, for example, to the embodiment of FIG. 1, as the bore 21 of the bushing 22 of the circuit board 19, which is to be tested by the contact element 12, is too large for the plane contact 14 without a cap.

In the embodiment of FIG. 2 the pointed tip 24 projects beyond the front surface 31 of the cap 17a; this projection may, for example be a length of only a fraction of a millimeter. Due to this projection the contact 14 is not changed in length by the cap being fitted thereonto. This is particularly advantageous, as the probe assembly may include a multiplicity of other such contacts 14 without a cap, and still other contacts 14 with caps. It is avantageous if all contacts 14 have the same length, irrespective whether they are provided with a cap or not.

The embodiment of FIGS. 3 and 4 is particularly suitable for applications, such as shown in FIG. 1, where the cap serves to contact metallic rims of bores in the circuit board, into which the point 24 projecting from the contact 14 may penetrate, without making electrical contact with the test region itself; this electrical contact is performed only by the cap. The apices 36 of the teeth may, in fact, also be implemented as longitudinal surfaces of a very small width, which perform, however, a sufficient scraping action to penetrate any oxidation layers on the test regions.

The embodiment of FIG. 5 is particularly suitable for those applications, as outlined in the aforesaid copending patent application, where the openings in the mask, as referenced in the aforesaid copendig patent application, are not completely aligned with the test points on the circuit board. The degree of lateral omvement is set by the limits of the pivoting action of the ball joint consisting of elements 40 and 39.

While the invention has been illustrated in preferred embodiments, it is not to be limited to the structures shown, since many variations thereof will be evident to one skilled in the art and are intended to be encompassed in the present invention as set forth in the following claims.

I claim:

1. A contact for a multicontact probe assembly for testing at least partially conductive elements, the contact comprising
   a conductive contact rod extending along an axis, and having a rear end, and a front end,
   a conductive cap engageable axially snugly over the front end of the rod, said front end being pointed so as to serve as a test end for testing said conductive elements upon said cap being removed from said front end of said rod, and
   securing means for releasably securing said cap on said front end, whereby at least two differently formed test contacts are obtainable on said probe assembly by selectable use and non-use of said cap.

2. The contact defined in claim 1, wherein the cap is formed at the axis with an axially throughgoing bore, the front end of said contact rod fitting into said bore so that said cap is axially placeable on said front end.

3. The contact defined in claim 1, wherein said securing means is a collar formed on said cap and provided with a plurality of rearwardly open slots so as to elastically grip said rod in back of its front end.

4. The contact defined in claim 1, wherein said conductive contact rod has a predetermined width in a region of said front end, and a width substantially equal with said predetermined width in another region behind the front end region.

5. The contact defined in claim 1, wherein said rod has a predetermined diameter, and said cap has a substantially greater diameter than said predetermined rod diameter.

6. The contact defined in claim 1, wherein the cap is formed at the axis with an axially throughgoing bore, the rod front end fitting into said bore and projecting axially from the cap beyond said bore.

7. The contact defined in claim 1, wherein the cap has a front surface lying on a frustocone centered on the axis.

8. The contact defined in claim 7, wherein the cap is formed with axially forwardly projecting and radially extending teeth having edged extending generally radially from the vicinity of the cap center outwardly, and lying on the frustocone, each edge having a substantially triangular cross-section with an apex thereof pointing outwardly.

9. The contact defined in claim 1, further comprising support means engaged axially behind the contact rod for resilient axial displacement thereof.

10. The contact defined in claim 9, wherein said support means includes a cylinder and a spring braced between a closed end of said cylinder and a rear end of said contact rod.

11. The contact defined in claim 1, wherein said contact rod is rigid.

12. The contact defined in claim 1, wherein said conductive cap has a front surface adapted for making contact with test points of said conductive elements.

13. The contact defined in claim 12, wherein said cap front surface is substantially conical.

14. The contact defined in claim 1 wherein the front end of the rod engaged with spacing in the cap.

15. A contact for a multicontact probe assembly for testing at least partially conductive elements, the contact comprising
   a conductive contact rod extending along an axis, and having a rear end, and a front end,
   a conductive cap engageable axially snugly over the front end of the rod, said front end being pointed so as to serve as a test end for testing said conductive elements upon said cap being removed from said front end of said rod,
   securing means for releasably securing said cap on said front end,
   resilient means engaged axially behind said contact for resilient axial displacement thereof, and
   freedom-of-movement means interconnected between said resilient means and said contact rod for permitting said contact rod limited lateral deflection
   whereby at least two differently formed test contacts are obtainable on said probe assembly by selectable use and non-use of said cap.

16. A contact head for use in conjunction with a multicontact probe assembly for testing at least partially conductive elements, the contact head comprising a conductive cap adapted to releasably engage a front end of a contact rod of said multicontact probe along an axial direction thereof, said conductive cap having a front surface adapted to be make contact wtih test points of said conductive elements, and being also engageable axially snugly over the front end of the rod, said front end being pointed so as to serve as a test end for testing said conductive elements upon said cap being removed from said front end of said rod, and securing means for releasably securing said cap on said front end, whereby at least two differently formed test contacts are obtainable on said probe assembly by selectable use and non-use of said cap.

* * * * *